(12) United States Patent
El Rai

(10) Patent No.: US 7,633,352 B2
(45) Date of Patent: Dec. 15, 2009

(54) INTEGRATED TUNABLE RESONANCE CIRCUIT

(75) Inventor: Samir El Rai, Duisburg (DE)

(73) Assignee: Atmel Duisburg GmbH, Duisburg (DE)

( * ) Notice: Subject to any disclaimer, the term of this patent is extended or adjusted under 35 U.S.C. 154(b) by 85 days.

(21) Appl. No.: 11/798,918

(22) Filed: May 17, 2007

(65) Prior Publication Data

US 2007/0268007 A1    Nov. 22, 2007

(30) Foreign Application Priority Data

May 17, 2006    (DE) .................. 10 2006 023 352

(51) Int. Cl.
*G01D 5/20* (2006.01)
*H03J 7/14* (2006.01)
*H03B 5/08* (2006.01)

(52) U.S. Cl. ............ 331/181; 331/36 L; 331/177 V; 331/179; 331/167

(58) Field of Classification Search ........... 331/36 C, 331/36 L, 117 R, 117 FE, 167, 177 V, 181, 331/179; 334/14, 15, 47; 336/146
See application file for complete search history.

(56) References Cited

U.S. PATENT DOCUMENTS

| | | | |
|---|---|---|---|
| 5,715,526 A | 2/1998 | Weaver, Jr. et al. | |
| 5,994,982 A * | 11/1999 | Kintis et al. | 333/235 |
| 6,049,702 A | 4/2000 | Tham et al. | |
| 6,255,913 B1 * | 7/2001 | Wang | 331/181 |
| 6,621,365 B1 | 9/2003 | Nallivuori et al. | |
| 6,778,022 B1 | 8/2004 | Zhang et al. | |
| 2005/0184820 A1* | 8/2005 | Hung et al. | 331/167 |
| 2006/0033587 A1* | 2/2006 | Cabanillas | 331/108 C |
| 2006/0055470 A1* | 3/2006 | Luong et al. | 331/36 L |
| 2007/0057739 A1* | 3/2007 | Maligeorgos et al. | 331/36 C |
| 2007/0146088 A1* | 6/2007 | Arai et al. | 331/167 |

* cited by examiner

*Primary Examiner*—Robert Pascal
*Assistant Examiner*—Ryan J. Johnson
(74) *Attorney, Agent, or Firm*—Muncy, Geissler, Olds & Lowe, PLLC

(57) ABSTRACT

An integrated tunable resonance circuit is provided for providing a high-frequency output signal with a frequency dependent on a control signal, comprising a parallel resonance circuit with a first inductive element and an output for providing the high-frequency output signal, a switching unit with a controlled path, and a control terminal for switching between states, whereby the switching unit is designed to exhibit a predominantly capacitive behavior in a first state and a predominantly resistive behavior in a second state, whereby the resonance circuit is designed to drive the control terminal of the switching unit as a function of the control signal. The resonance circuit has a second inductive element which can be mutually coupled to the first inductive element, whereby the controlled path is connected parallel to the second inductive element. The invention relates furthermore to a voltage-controlled oscillator and to an integrated circuit.

22 Claims, 3 Drawing Sheets

INTEGRATED TUNABLE RESONANCE CIRCUIT

This nonprovisional application claims priority under 35 U.S.C. §119(a) to German Patent Application No. DE 102006023352, which was filed in Germany on May 17, 2006, and which is herein incorporated by reference.

BACKGROUND OF THE INVENTION

1. Field of the Invention

The present invention relates to an integrated tunable resonance circuit. The invention relates furthermore to a voltage-controlled oscillator and to an integrated circuit.

2. Description of the Background Art

The invention falls within the field of integrated circuits (IC). It falls particularly within the field of integrated tunable resonance circuits for providing a high-frequency output signal with a (target) frequency dependent on a control signal. Resonance circuits of this type are used in many cases in high-frequency circuit arrangements (radio frequency, RF), such as voltage-controlled oscillators, amplifiers, tuners, etc., in transmitting/receiving devices of telecommunication systems.

U.S. Pat. No. 6,778,022 B1 discloses an LC parallel resonance circuit (FIG. 2A), whose oscillation frequency is set (tuned) by changing accordingly the value of variable capacitances of the parallel resonance circuit. For this purpose, capacitors are connected individually into the resonance circuit with the use of digitally controlled switching elements, which are connected in series to each capacitor, or are not connected to said circuit (FIG. 3).

It is a disadvantage here that the switching elements in the closed state represent a not negligible series resistance, which has a negative impact on the quality of the resonance circuit. If the quality of the width of the switching elements is increased, the stray capacitance of the switching elements increases, however. As a result, in the opened state, the total capacity of the resonance circuit increases, so that the maximum settable frequency and thereby the width of the tuning range in which the frequency can be set decrease. An increase in quality can therefore only be achieved at the expense of tunability or an improvement in tunability can be achieved only at the expense of the quality of the resonance circuit.

SUMMARY OF THE INVENTION

It is therefore an object of the present invention to provide integrated resonance circuits, which are simple and cost-effective to implement, and voltage-controlled oscillators, which have an improved tunability without detrimentally affecting the quality and/or a higher quality without restricting tunability and are robust to noise disturbances of the control signal, so that powerful integrated circuits can be realized with saving of effort.

The integrated tunable resonance circuit of the invention for providing a high-frequency output signal with a frequency, dependent on a control signal, comprises (A) a parallel resonance circuit with a first inductive element and an output for providing the high-frequency output signal, (B) a switching unit with a controlled path and a control terminal for switching between states, whereby the switching unit is designed to exhibit a predominantly capacitive behavior in a first state (OFF) and a predominantly resistive behavior in a second state (ON), and (C) a second inductive element, which can be coupled mutually to the first inductive element, whereby (D) the resonance circuit is designed to drive the control terminal of the switching unit as a function of the control signal, and (E) the controlled path is connected parallel to the second inductive element.

The voltage-controlled oscillator of the invention has at least one such resonance circuit.

The integrated circuit of the invention has at least one such resonance circuit and/or at least one such voltage-controlled oscillator.

The essence of the invention is to provide, in addition to the (first) parallel resonance circuit, at least one additional disconnectable (second) parallel resonance circuit, whose (second) inductive element is mutually coupled to the (first) inductive element of the first parallel resonance circuit and which has, parallel to the second inductive element, a switching unit with a controlled path which is connected parallel to the second inductive element.

Because the switching unit of the disconnectable parallel resonance circuit is driven accordingly by using a control signal, the effective inductance value of the first inductive element and thereby the frequency of the output signal change due to the mutual coupling. An improved tunability is advantageously achieved in this way without a detrimental effect on quality and/or a higher quality without restriction of the tunability. In addition, a higher robustness to noise disturbances of the control signal is made possible. Furthermore, it is made possible advantageously to keep the resonance circuit resistance constant during resonance and the amplitude of the output signal, e.g., in a voltage-controlled oscillator constant during the tuning process.

In an embodiment, the capacitive behavior of the switching unit is completely based on a capacitance of the controlled path in the first state. This type of resonance circuit is especially simple to implement.

In another embodiment, the capacitive behavior of the switching unit is based on the capacitance of the controlled path in the first state and a capacitive unit connected parallel to the controlled path. As a result, the total capacitance value of the switching unit advantageously can be kept constant with a variable value of the capacitance in the controlled path. Especially high resonance circuit qualities can be achieved advantageously in this way.

Preferably, the switching unit can have a field-effect transistor, whose drain-source channel forms the controlled path and whose gate terminal is connected to the control terminal. A resonance circuit of this type is very cost-effective to realize and utilizes little chip surface.

In another embodiment, the switching unit has a microelectromechanical switching element. Very low ohmic resistance values are advantageously possible in this way and thereby very high qualities in the ON state.

In an embodiment, the (first) parallel resonance circuit has a first capacitive unit, connected parallel to the first inductive element, with a preferably settable capacitance value. The resonance circuit is designed to set the settable capacitance value of the first capacitive unit as a function of at least one additional control signal. A resonance circuit of this type has an especially broad tuning range and/or an especially high frequency resolution during tuning.

In another embodiment, the first capacitive unit is a parasitic capacitance. This type of resonance circuit is especially simple to implement.

In another embodiment, the switching unit has a second capacitive unit connected parallel to the controlled path. As a result, the total capacitance value of the switching unit advantageously can be kept constant with a variable value in capacitance in the controlled path. Especially high resonance circuit qualities can be achieved advantageously in this way.

According to another embodiment, the second capacitive unit has a settable capacitance value and the resonance circuit is designed to set the settable capacitance value of the second capacitive unit as a function of at least one additional control signal. A resonance circuit of this type has an especially broad tuning range and/or an especially high frequency resolution during tuning.

In another embodiment, the second inductive element has two series-connected inductive subelements and the first potential value can be applied at the connection point of the inductive subelements when the switching unit is in the first state, and a different second potential value when the switching unit is in the second state. Especially high resonance circuit qualities and an increased robustness of the control signal to noise can be achieved advantageously in this way.

In another embodiment, a third inductive element, which can be mutually coupled to the first inductive element, and a second switching unit, connected parallel to the third inductive element, with a second controlled path are provided, whereby the second controlled path is connected parallel to the third inductive element. The frequency resolution of the resonance circuit is advantageously finer as a result.

In another embodiment, at least one first resonance circuit and a second resonance circuit is provided, whereby a separate parallel resonance circuit of the second resonance circuit is connected parallel to the first inductive element of the first resonance circuit. The frequency resolution of the resonance circuit is advantageously finer as a result. In addition, several output signals are provided in this way, which differ in their amplitude.

In typical embodiments, the integrated circuit is designed as a monolithically integrated circuit, as a hybrid circuit, or as a multilayer-ceramic circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
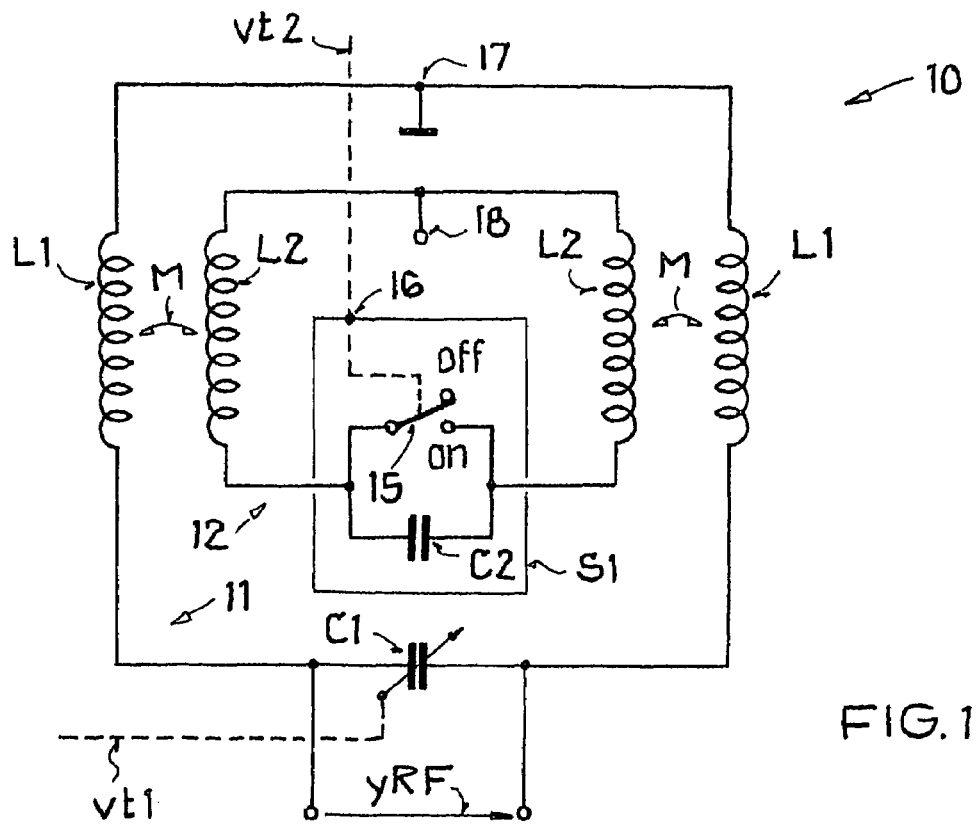
FIG. 1 shows a first exemplary embodiment of a resonance circuit of the invention.

In the figures, the same and functionally identical elements and signals, if not specified otherwise, are provided with the same reference characters.

FIG. 1 shows a circuit diagram of a first exemplary embodiment of a resonance circuit of the invention. Resonance circuit 10 has a first parallel resonance circuit 11 and a disconnectable second parallel resonance circuit 12.

The first parallel resonance circuit 11 comprises a first inductive element L1 and a parallel connected first capacitive unit C1. The high-frequency output signal yRF, which is provided by resonance circuit 10 with appropriate excitation and has a (target) frequency f0, for example, in the gigahertz range (tunable, e.g., from 10 GHz to 14 GHz), can be tapped, e.g., at the terminals of capacitive unit C1.

The capacitive unit C1 preferably has a settable capacitance value, which is set with the use of at least one control signal vt1. Capacitive unit C1 can have, for example, a unit with a continuously variable capacitance value, such as, e.g., a varactor, capacitive, or MOS diode (metal oxide semiconductor), or an MEM varactor (microelectromechanical), and/or a unit with a stepwise variable capacitance value, which is made, e.g., as a switched MIM capacitor (metal-insulator-metal), switched polycap, or as a switched capacitor bank (capacitive digital-analog converter, CDAC). Preferably, capacitive unit C1 has a varactor diode and a parallel-connected capacitor bank (CDAC). Alternatively, capacitive unit C1 can have a fixed capacitance value. In another embodiment, capacitive unit C1 is a parasitic capacitance, e.g., of an amplification element with which the resonance circuit of the invention is used, e.g., in a voltage-controlled oscillator.

The disconnectable second parallel resonance circuit 12 has a parallel circuit of a second inductive element L2 and a switching unit S1. Second inductive element L2 is hereby mutually (inductively) coupled to first inductive element L1, which is illustrated in FIG. 1 by the double arrow and the coupling inductance M.

Switching unit S1 has a controlled path 15, a control terminal 16 for switching the controlled path between a turned off/opened ("OFF") and a turned on/closed ("ON") state and preferably a second capacitive unit C2 connected parallel to the controlled path. Controlled path 15 is thereby connected directly parallel to second inductive element L2. Control signal vt2 is applied at control terminal 16, so that switching unit S1 or controlled path 15 is driven as a function of control signal vt2 and thus switches between the states ON and OFF.

In the opened state (OFF), switching unit S1 has a predominantly capacitive behavior, whereas in the closed state (ON) it exhibits a predominantly resistive behavior. This means that the capacitive behavior predominates in the opened state and the resistive behavior in the closed state. The capacitive behavior of switching unit S1 hereby depends on the capacitance C_off of controlled path 15 in the OFF state and optionally the capacitance of capacitive unit C2, whereas the resistive behavior is attributed to the ohmic resistance Ron of controlled path 15 in the ON state.

If present, capacitive unit C2 preferably has a fixed capacitance value and is designed, e.g., as a MIM capacitor or as a distributed capacitance. Alternatively, it can have a settable capacitance value and can be made, e.g., as a varactor, MEM varactor, switched MIM capacitor, and/or switched capacitor bank.

Preferably, the resonance circuit of the invention—as shown in FIG. 1—is realized differentially and therefore provides a differential output signal yRF, whose frequency f0 depends on the control signals vt1 and vt2. If first inductive element L1—as is also shown in FIG. 1—is divided in two subelements with identical inductance values, a so-called alternating ground (virtual ground) becomes established at their connecting point 17. If second inductive element L2 is also divided into two subelements with identical inductance values, thus—as will be described in greater detail hereafter—the DC potential can be advantageously set at its connecting point 18.

Alternatively, the resonance circuit of the invention can be made non-differential (single ended).

Inductive elements L1, L2 are preferably designed as conductor loops arranged in one or more metallization levels of an integrated circuit. Alternatively, these can also be bond wires or other connecting means, such as, e.g., small solder balls, flip-chip junctions, etc.

The operating mode of the resonance circuit of the invention will be described below according to the foregoing description with reference to FIG. 1.

Figure 2:
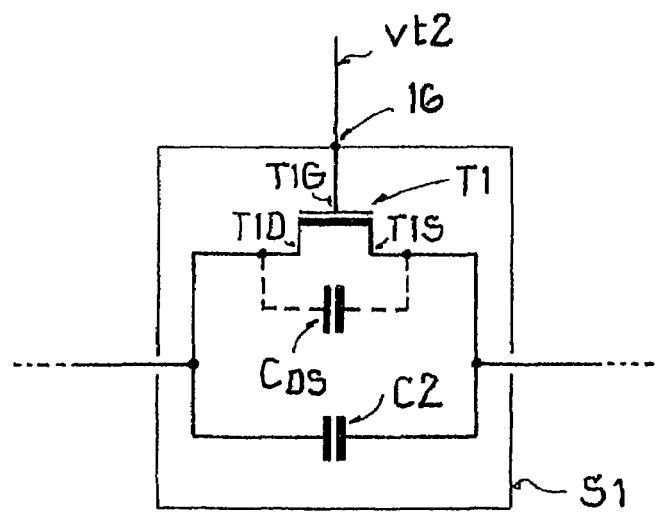
FIG. 2 shows an embodiment of the switching unit of FIG. 1.

FIG. 2 shows a preferred embodiment of switching unit S1 with a field-effect transistor (MOSFET). Field-effect transistor T1 has a drain terminal T1D, a source terminal T1S, and a gate terminal T1G. The drain-source channel of field-effect transistor T1 forms controlled path 15 (see FIG. 1) of switching unit S1 and is connected parallel to the preferably provided capacitive unit C2. The gate terminal T1G is connected to control terminal 16, so that control signal vt2 is applied at gate terminal T1G.

In the turned off/opened state (OFF), transistor T1 or its drain-source channel represents predominantly a capacitance C_off, which is shown as a broken line in FIG. 2 and is designated as drain-source capacitance C_DS. In the turned off/closed state (ON), transistor T1 or its drain-source channel represents predominantly an ohmic resistance Ron.

In another embodiment, switching unit S1 has a microelectromechanical switching element (MEM) instead of a field-effect transistor.

In the following text, the operating mode of the resonance circuit, previously described in regard to FIGS. 1 and 2, will be described in greater detail.

In the closed state (ON), switching unit S1 shorts second inductive element L2 and thus largely prevents the formation of a magnetic field. As a result, the inductance value of the first inductive element declines to the effective inductance value $$L1\_eff = L1 - M^2/L2 < L1, \quad (1)$$

where M designates the coupling inductance and L1, L2 the inductance values of the first or second inductive element. The ohmic resistance Ron of controlled path 15 should be as small as possible in this case.

In the opened state (OFF), controlled path 15 acts as capacitance C_off (in the case of the MOSFET, C_off=C_DS applies), so that a parallel resonance circuit of second inductive element L2 and of a parallel circuit of capacitances C_off=C_DS and C2 forms. Due to the mutual (inductive) coupling between inductive elements L1 and L2, effective inductance value L1_eff assumes the following value $$L1\_eff = L1 + [(\omega M)^2 C2\_res/(1 - \omega^2 L2\, C2\_res)] \quad (2)$$

where C2_res=C2+C_off designates the total capacitance of the parallel circuit of capacitances C2 and C_off and $\omega = 2\pi f$, the angular frequency.

According to equation (2), the inductance value of the first inductive elements increases effectively, when the expression $\omega^2\, L2\, C2\_res$ is less than one, i.e., $$L1\_eff > L1, \text{ if } \omega^2 < 1/(L2\, C2\_res) = (2\pi f2)^2. \quad (3)$$

The inductance value L2 and capacitance value C2_res are advantageously selected such that the resonance frequency f2 of the disconnectable parallel resonance circuit 12 is above the operating frequency $f = \omega/2\pi$ or the frequency f0 of the output signal yRF.

Due to the effective decline in the inductance value of the first inductive element according to equation (1), the maximum settable frequency of the resonance circuit increases, whereas the minimum settable frequency declines due to the effective increase according to equations (2) and (3). The tuning range of the resonance circuit is thereby increased. In particular, increases in the value of the coupling inductance M hereby lead to a broadening of the tuning range.

The setting of the target frequency f0 of output signal yRF occurs in the resonance circuit according to FIGS. 1, 2 by changing the capacitance value of first capacitive unit C1 and by changing the effective inductance value L1_eff according to equations (1)-(3), whereby the capacitance value C1 is set by using at least one control signal vt1 and the effective inductance value L1_eff is influenced at least by control signal vt2.

A subdivision of this type of the frequency tuning of a resonance circuit into direct tuning of resonance circuit capacitance (C1) and indirect tuning of a resonance circuit inductance (L1_eff) by a capacitively tunable and mutually (inductively) coupled second resonance circuit (12) opens the possibility of distributing a required total tunability (width of the range of the target frequencies f0) in an optimized way to the direct and indirect tuning in such a way that further requirements for the resonance circuit, particularly for the quality of the resonance circuit, can be met.

If the quality of a capacitive element (e.g., C1) is considered as a function of its tunability AC=C1max/C1min, the quality declines with increasing tunability AC at first slowly, but much more rapidly starting at a certain limit AC_lim of the tunability. If a required high total tunability is realized exclusively by a direct tuning of capacitances, the resonance circuit may have only a low quality due to this fact. However, if, e.g., the capacitances of the tunabilities AC are designed as below the limit AC_lim and the remaining tunability, necessary in view of the required total tunability, is achieved by indirect tuning of the resonance circuit inductance, overall considerably higher resonance circuit qualities can be achieved, as simulations and further tests by the applicant have confirmed.

In order to increase further the quality of the resonance circuit according to FIGS. 1 and 2, the quality with a closed switching unit (ON) is advantageously increased by increasing the width of transistor T1 and thereby reducing the resistance Ron. This in fact leads to an increase in the capacitance C_DS=C_off, which is advantageously compensated in the foregoing described resonance circuit of the invention by accordingly reducing the capacitance value C2 of the second capacitive element, so that the total capacitance C2_res=C2+C_off is constant and the width of the tuning range according to equation (2) remains unchanged. It is possible to achieve advantages with a closed switching unit (ON) (higher qualities) in this way, without having to accept the disadvantages with an opened switching unit (OFF) (rather narrow tuning range). In the extreme case, the capacitance C_DS=C_off is so high that second capacitive element C2 is eliminated.

For a further increase of the resonance circuit quality, advantageously the quality with an opened switching unit (OFF) is increased by applying preferably the inverted control signal vt2_inv at connection point 18 (see FIG. 1). If the control signal vt2 can assume, for example, the two voltage values 3 V and 0 V, in order to open or close transistor T1, vt2_inv assumes the value 3 V when vt2=0 V, and vt2_inv=0 V when vt2=3 V. In this way, controlled path 15 is supplied with DC potentials depending on the state of the switching unit, which lead to a higher quality of the drain-source capacitance and thereby to a higher resonance circuit quality (advantageously no resistors are thereby necessary for operating point setting, which leads to an increased robustness to noise). The associated reduction in the capacitance C_DS is advantageously compensated by an increase in the capacitance C2.

In another embodiment, the following potential values are applied at connection point 18, whereby again the two exemplary voltage values 3 V and 0 V are assumed for the control signal vt2:

0 V, if vt2=0 V (state 1)
3 V, if vt2=0 V (state 2)
0 V, if vt2=3 V (state 3)

In this case, a total of three states results, whereby switching unit S1 in states 1 and 2 has a predominantly capacitive behavior and in state 3 a predominantly resistive behavior. States 1 and 2 differ here in the capacitance value of the drain source capacitance C_DS. The frequency resolution of the resonance circuit is advantageously finer as a result.

Alternatively, a fixed reference potential (ground) can be applied at connection point 18.

The resonance circuit of the invention, furthermore, makes it possible to assure by suitable selection of the values of M, C2, L2, C1, L1 that the resonance circuit resistance advantageously does not change substantially during resonance and thereby the amplitude of the output signal yRF, e.g., in a voltage-controlled oscillator during the tuning process. If the minimum or maximum effective inductance value L1_eff is designated, respectively, as L1min or AL*L1min and the minimum or maximum capacitance value of the first capacitive unit C1 is designated by C1min or AC*C1min, respectively, the values of these parameters are to be selected such that the two factors AL and AC correspond as well as possible (AL=AC). In this case, the resonance circuit resistance remains constant during resonance and thereby the amplitude of the output signal yRF during the tuning process.

With sufficiently large capacitance values C_off or C_DS, in other exemplary embodiments, capacitive unit C2, shown in FIGS. 1 and 2, of switching unit S1 is advantageously eliminated. In this case, the capacitive behavior of switching unit S1 in the OFF state is based exclusively on the capacitance C_off or C_DS of controlled path 15 in the OFF state.

Another advantage arises when the resonance circuit of the invention is used, e.g., in a voltage-controlled oscillator (VCO). Parasitic capacitances of amplification elements (transistors) of the VCO in fact reduce the tuning portion here due to direct tuning of resonance circuit capacitances, but not the portion attributable to indirect tuning, according to the invention, of resonance circuit inductances (L1_eff).

Figure 3:
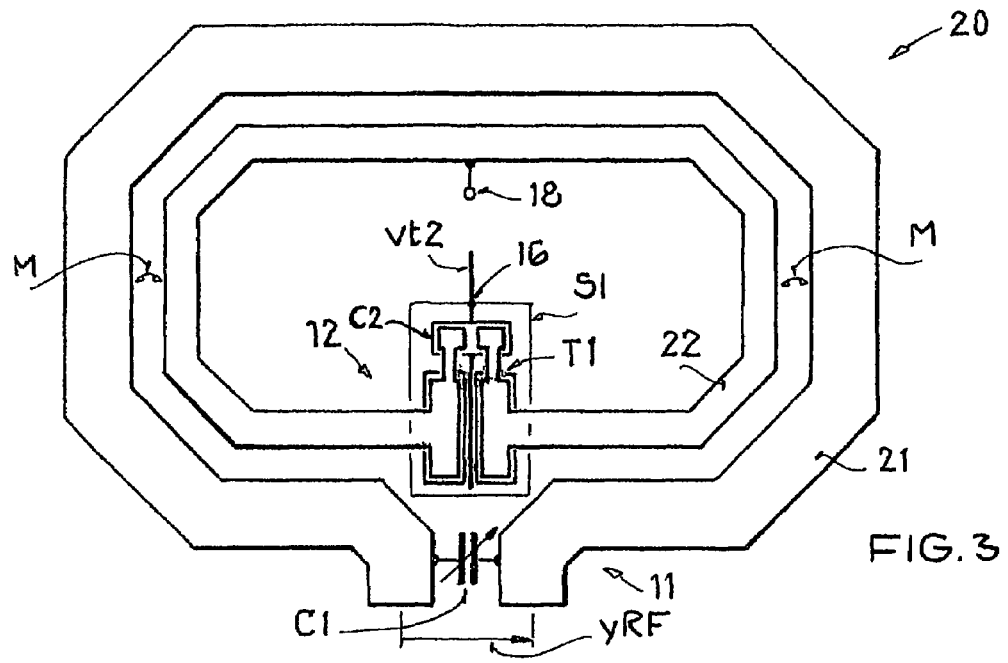
FIG. 3 shows a second exemplary embodiment of a resonance circuit of the invention (top plan view).

FIG. 3 shows schematically a layout of a second exemplary embodiment of a resonance circuit of the invention. The top plan view according to FIG. 3 corresponds to a detail from a horizontal cutting plane through an integrated circuit with a resonance circuit 10 of the invention according to FIGS. 1 and 2. Resonance circuit 20 has a first parallel resonance circuit 11 and a disconnectable second parallel resonance circuit 12.

First parallel resonance circuit 11 has a first conductor loop 21, which forms first inductive element L1 and to which a first capacitive unit C1, designed as a varactor diode with a parallel-connector capacitor bank (CDAC), is connected (shown symbolically in FIG. 3). Disconnectable second parallel resonance circuit 12 has a second conductor loop 22, which forms second inductive element L2 and to which field-effect transistor T1 and—parallel hereto—a second capacitive unit C2, designed as an MIM capacitor, are connected, which together form switching unit S1. Transistor T1 in this case has a plurality of drain-source "fingers."

Both conductor loops 21, 22 are mutually coupled.

Disconnectable second parallel resonance circuit 12 is preferably arranged within or alternatively outside first parallel resonance circuit 11.

In other embodiments, conductor loop 21 and/or conductor loop 22 have several turns (complete loops). The number of turns in this case in both conductor loops can be similar or different.

The conductor loops can also be made rectangular, square, oval, round, or with "rounded corners" instead of the quasi-octahedral form according to FIG. 3.

Figure 4:
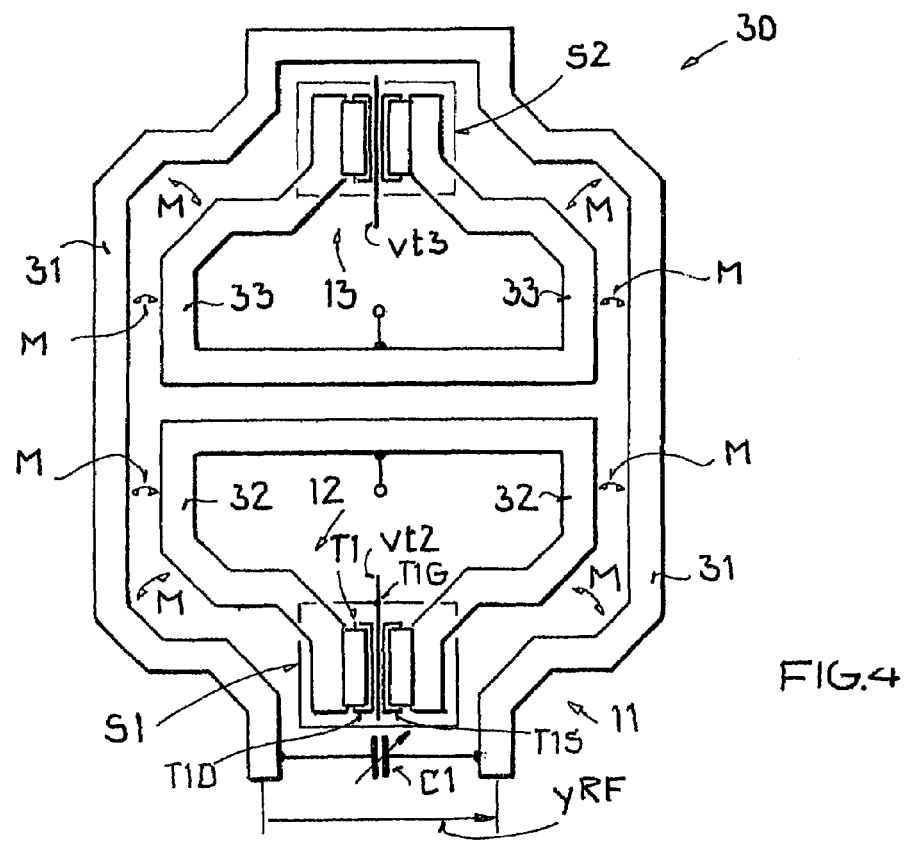
FIG. 4 shows a third exemplary embodiment of a resonance circuit of the invention (top plan view).

FIG. 4 shows schematically a layout of a third exemplary embodiment of a resonance circuit of the invention. Two disconnectable parallel resonance circuits 12, 13 are arranged within first parallel resonance circuit 11 in resonance circuit 30 and mutually coupled to said circuit.

First parallel resonance circuit 11 has a first conductor loop 31, which forms first inductive element L1 and to which a first capacitive unit C1, designed as a varactor, is connected (shown symbolically in FIG. 4). First disconnectable parallel resonance circuit 12 has a second conductor loop 32, which forms a second inductive element L2 and to which a first switching unit S1 is connected. Second disconnectable parallel resonance circuit 13 has a third conductor loop L3, which forms a third inductive element 33 and to which a second switching unit S2 is connected.

Switching units S1, S2 each have a controlled path connected parallel to element L2 (32) or L3 (33), which is driven by a control signal vt2 or vt3. The controlled paths are formed by field-effect transistors (MOSFET) in this exemplary embodiment. Separate capacitive elements are not provided in switching units S1, S2, so that the switching units in this exemplary embodiment contain exclusively field-effect transistors, on whose drain-source capacitance the capacitive behavior of the switching units in the OFF state depends.

First conductor loop 31 or first inductive element L1 in this exemplary embodiment is mutually coupled to second and third conductor loop 32, 33 or to second and third inductive element L2, L3, as is evident from the double arrow in FIG. 4.

Conductor loops 31-33, analogous to the corresponding statements in regard to FIG. 3, can also be made rectangular, oval, etc.

In other embodiments, conductor loops 31, 32, and/or 33 have a plurality of turns (complete loops), whereby the number of turns varies or agrees from conductor loop to conductor loop.

In other exemplary embodiments, more than two disconnectable parallel resonance circuits are provided, whose inductive elements are each mutually coupled to the first parallel resonance circuit. The more disconnectable parallel resonance circuits are provided, the finer the frequency resolution of the resonance circuit, i.e., the increment of the frequency tuning.

Regardless of their number, the disconnectable parallel resonances circuits are arranged within or outside the first parallel resonance circuit.

Figure 5:
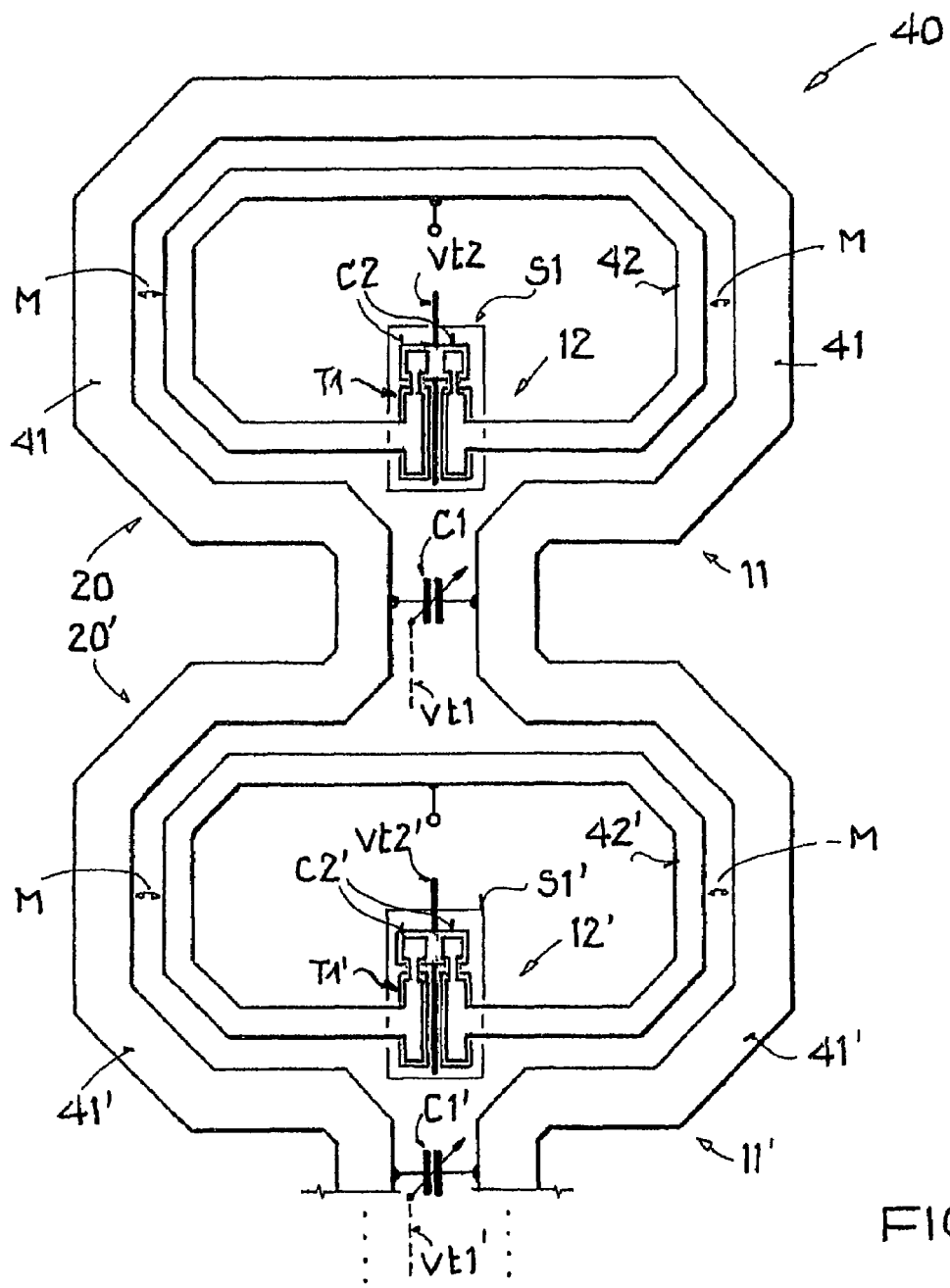
FIG. 5 shows a fourth exemplary embodiment of a resonance circuit of the invention (top plan view).

FIG. 5 shows schematically a layout of a preferred fourth exemplary embodiment of a resonance circuit of the invention. In resonance circuit 40, a plurality of resonances circuits 20, 20', . . . of the invention are connected to one another.

In the upper half of FIG. 5, resonance circuit 20 is shown according to the foregoing description in regard to FIG. 3. It comprises a first parallel resonance circuit 11 with a first conductor loop 41 and a symbolically depicted first capacitive unit C1, and a disconnectable second parallel resonance circuit 12 with a mutually coupled second conductor loop 42 and a switching unit S1.

Another resonance circuit 20' is connected to the terminals of first capacitive unit C1; first parallel resonance circuit 11' of said additional circuit was separated in the center of its conductor loop 41' and connected to the terminals of capacitive unit C1 of first resonance circuit 20. As a result, separated first resonance circuit 11' is connected parallel to conductor loop 41 or to first capacitive unit C1 of first resonance circuit 20. The additional resonance circuit 20' also has a disconnectable second parallel resonance circuit 12' with a mutually coupled (to 41') second conductor loop 42' and a switching unit S1'. Reference in this case as well is made to the foregoing description.

Each of the foregoing described exemplary embodiments can be continued a total of N times in this way. The frequency resolution of the resonance circuit becomes advantageously finer with each additional resonance circuit stage in addition, a total of N output signals yRF are provided in this way, which differ in their amplitude and can be tapped at capacitive units C1, C1' of first parallel resonance circuit 11, 11'.

According to FIG. 5, the conductor loops of each stage are designed identical (41=41', 42=42') and the structural elements of all stages have identical values (optionally at the same value of the control signals). In other exemplary embodiments, the structural element values change from stage to stage. Preferably, both the widths and radii of the conductor loops decrease and the capacitance values increase accordingly from stage to stage (e.g., from top to bottom in FIG. 5).

The statements made previously in regard to FIGS. 3-4 relative to the embodiment of the traces (rectangular, oval, etc.), the number of turns per trace or inductive element, and the number and arrangement of the disconnectable parallel resonance circuits apply accordingly also to the exemplary embodiment according to FIG. 5.

The resonance circuit of the invention, described previously with reference to the exemplary embodiments, can be used advantageously in the most diverse applications in oscillator, resonator, amplifier, tuner circuits, etc.

The resonance circuit of the invention or the mentioned circuits are each preferably a component of an integrated circuit, which, e.g., is made as a monolithically integrated circuit (e.g., application specific integrated circuit, ASIC, or application specific standard product, ASSP), as a hybrid circuit (thin- or thick-layer technology), or as a multilayer-ceramic circuit arrangement.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated tunable resonance circuit for providing a high-frequency output signal with a frequency that is dependent on a control signal, the circuit comprising:
   a parallel resonance circuit with a first inductive element and an output for providing the high-frequency output signal;
   a second inductive element, which is coupled mutually to the first inductive element; and
   a switching unit connected in parallel to the second inductive element and having multiple parallel branches, the branches including a first branch formed of a switch having a control terminal for switching between states and a second branch formed of a capacitive unit, wherein the switching unit exhibits a capacitive behavior in a first state with the switch open and a resistive behavior in a second state with the switch closed, the resonance circuit driving the control terminal of the switch as a function of the control signal.

2. The resonance circuit according to claim 1, wherein the capacitive behavior of the switching unit is based partially on a capacitance of the switch in the first state.

3. The resonance circuit according to claim 2, wherein the capacitive behavior of the switching unit is further based on a capacitance of the capacitive unit.

4. The resonance circuit according to claim 1, wherein the resistive behavior of the switching unit is based on an ohmic resistance of the switch in the second state.

5. The resonance circuit according to claim 1, wherein the switch is a field-effect transistor whose drain-source channel forms a controlled current path when the switch is closed and whose gate terminal is connected to the control terminal.

6. The resonance circuit according to claim 1, wherein the switch is a microelectromechanical switching element.

7. The resonance circuit according to claim 1, wherein the parallel resonance circuit has a second capacitive unit connected in parallel to the first inductive element.

8. The resonance circuit according to claim 7, wherein the second capacitive unit has a settable capacitance value and the resonance circuit is designed to set the settable capacitance value of the second capacitive unit as a function of at least one additional control signal.

9. The resonance circuit according to claim 7, wherein the second capacitive unit has at least one metal-insulator-metal capacitor, a varactor, a switched MIM capacitor, or a switched capacitor bank.

10. The resonance circuit according to claim 7, wherein the second capacitive unit is a parasitic capacitance.

11. The resonance circuit according to claim 1, wherein the capacitive unit is connected in parallel to the second inductive element.

12. The resonance circuit according to claim 1, wherein the capacitive unit has a settable capacitance value and the resonance circuit is designed to set the settable capacitance value of the first capacitive unit as a function of at least one additional control signal.

13. The resonance circuit according to claim 1, wherein the capacitive unit has at least one metal-insulator-metal capacitor, a varactor, a switched MIM capacitor, or a switched capacitor bank.

14. The resonance circuit according to claim 1, wherein the capacitive unit is designed as a distributed capacitance.

15. The resonance circuit according to claim 1, wherein the second inductive element has two series-connected inductive subelements.

16. The resonance circuit according to claim 1, further comprising:
   a third inductive element, which is mutually coupled to the first inductive element,
   a second switching unit connected in parallel to the third inductive element, and having at least a second switch, wherein the second switch is connected in parallel to the third inductive element.

17. The resonance circuit according to claim 1, wherein at least one first resonance circuit and a second resonance circuit according to claim 1 is provided, wherein a separate parallel resonance circuit of the second resonance circuit is connected in parallel to the first inductive element of the first resonance circuit.

18. A Voltage-controlled oscillator comprising at least one resonance circuit according to claim 1.

19. An integrated circuit comprising at least one resonance circuit according to claim 1.

20. The integrated circuit according to claim 19, wherein the integrated circuit is designed as a monolithically integrated circuit, a hybrid circuit, or a multilayer-ceramic circuit.

21. An integrated circuit comprising at least one voltage-controlled oscillator according to claim 18.

22. An integrated tunable resonance circuit for providing a high-frequency output signal with a frequency that is dependent on a control signal, the circuit comprising:
- a parallel resonance circuit with a first inductive element and an output for providing the high-frequency output signal;
- a switching unit with a controlled path and a control terminal for switching between states, wherein the switching unit exhibits a capacitive behavior in a first state and a resistive behavior in a second state, the resonance circuit driving the control terminal of the switching unit as a function of the control signal; and
- a second inductive element, which is coupled mutually to the first inductive element,
- wherein the controlled path is connected in parallel to the second inductive element,
- wherein the second inductive element has two series-connected inductive subelements, and
- wherein a first potential value is applied at the connection point of the inductive subelements when the switching unit is in the first state, and a different second potential value is applied when the switching unit is in the second state.

* * * * *